(12) United States Patent
Leussler et al.

(10) Patent No.: US 9,535,142 B2
(45) Date of Patent: Jan. 3, 2017

(54) MULTICHANNEL RF VOLUME RESONATOR FOR MRI

(75) Inventors: Christoph Leussler, Hamburg (DE); Christian Findeklee, Hamburg (DE); Wilhelmus Reinerius Maria Mens, Vaught (NL)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 531 days.

(21) Appl. No.: 14/112,152

(22) PCT Filed: Apr. 13, 2012

(86) PCT No.: PCT/IB2012/051815
§ 371 (c)(1),
(2), (4) Date: Oct. 16, 2013

(87) PCT Pub. No.: WO2012/143833
PCT Pub. Date: Oct. 26, 2012

(65) Prior Publication Data
US 2014/0055136 A1 Feb. 27, 2014

Related U.S. Application Data

(60) Provisional application No. 61/531,157, filed on Sep. 6, 2011.

(30) Foreign Application Priority Data

Apr. 21, 2011 (EP) ..................................... 11163484

(51) Int. Cl.
*G01V 3/00* (2006.01)
*G01R 33/34* (2006.01)
(Continued)

(52) U.S. Cl.
CPC ..... *G01R 33/34092* (2013.01); *G01R 33/3415* (2013.01); *G01R 33/3664* (2013.01); *G01R 33/5612* (2013.01)

(58) Field of Classification Search
USPC ........................................................ 324/309
See application file for complete search history.

(56) References Cited

U.S. PATENT DOCUMENTS 5,179,332 A * 1/1993 Kang ................. G01R 33/3607
324/307
6,519,343 B1 2/2003 Mansfield
(Continued)

FOREIGN PATENT DOCUMENTS

EP 1319957 A1 6/2003
WO 2005034141 A2 4/2005
(Continued)

OTHER PUBLICATIONS

Van Den Bergen et al, "7 T Body MRI: B1 Shimming With Simultaneous SAR Reduction", Physics in Medicine and Biology, vol. 52, No. 17, Sep. 7, 2007, pp. 5429-5441.
(Continued)

*Primary Examiner* — Rodney Fuller

(57) ABSTRACT

An RF volume resonator system is disclosed comprising a multi-port RF volume resonator (40, 50; 60), like e.g. a TEM volume coil or TEM resonator, or a birdcage coil, all of those especially in the form of a local coil like a head coil, or a whole body coil, and a plurality of transmit and/or receive channels (T/RCh1, . . . T/RCh8) for operating the multi-port RF volume resonator for transmitting RF excitation signals and/or for receiving MR relaxation signals into/from an examination object or a part thereof. By the individual selection of each port (P1, . . . P8) and the appropriate amplitude and/or frequency and/or phase and/or pulse shapes of the RF transmit signals according to the physical
(Continued)

properties of an examination object, a resonant RF mode within the examination object with an improved homogeneity can be excited by the RF resonator.

18 Claims, 11 Drawing Sheets

(51) Int. Cl.
  *G01R 33/3415* (2006.01)
  *G01R 33/36* (2006.01)
  *G01R 33/561* (2006.01)

(56) References Cited

U.S. PATENT DOCUMENTS

| | | | | |
|---|---|---|---|---|
| 6,940,282 | B2* | 9/2005 | Dumoulin | G01R 33/5612 |
| | | | | 324/318 |
| 6,969,992 | B2* | 11/2005 | Vaughan | G01R 33/3415 |
| | | | | 324/309 |
| 7,180,291 | B2* | 2/2007 | Chmielewski | G01R 33/34046 |
| | | | | 324/318 |
| 7,183,770 | B2* | 2/2007 | Graßlin | G01R 33/3415 |
| | | | | 324/318 |
| 7,285,957 | B2 | 10/2007 | Boskamp et al. | |
| 7,508,212 | B2 | 3/2009 | Fain et al. | |
| 7,701,213 | B2 | 4/2010 | Graesslin et al. | |
| 2006/0214661 | A1* | 9/2006 | Steen | G01R 33/583 |
| | | | | 324/318 |
| 2007/0164742 | A1 | 7/2007 | Bito et al. | |
| 2008/0088305 | A1* | 4/2008 | Olson | G01R 33/246 |
| | | | | 324/309 |
| 2008/0129298 | A1 | 6/2008 | Vaughan et al. | |
| 2012/0268132 | A1* | 10/2012 | Zhu | G01R 33/34 |
| | | | | 324/322 |

FOREIGN PATENT DOCUMENTS

| | | |
|---|---|---|
| WO | 2006033047 A2 | 3/2006 |
| WO | 20070124246 A1 | 11/2007 |
| WO | 2009074965 A1 | 6/2009 |

OTHER PUBLICATIONS

Graesslin et al, "Whole Body 3T MRI System With Eight Parallel RF Transmission Channels", International Society for Magnetic Resonance in Medicine, May 6, 2006, p. 129.

Avdievich et al, "4 T Actively Detuneable Double-Tune 1H/31P Head Volume Coil and Four-Channel 31P Phased Array for Human Brain Spectroscopy", Journal of Magnetic Resonance, 186, 2007, pp. 341-346.

Vaughan et al, "RF Image Optimization at 7T & 9.4T", Proc. Int'l. Soc. Mag. Reson. Med. 13, 2005, p. 953.

* cited by examiner

MULTICHANNEL RF VOLUME RESONATOR FOR MRI

CROSS-REFERENCE TO PRIOR APPLICATIONS

This application is the U.S. National Phase application under 35 U.S.C. §371 of International Application No. PCT/IB2012/051815, filed on Apr. 13, 2012, which claims the benefit of European Patent Application No. 11163484.6, filed on Apr. 21, 2011 and U.S. Provisional Patent Application No. 61/531,157, filed Sep. 6, 2011. These applications are hereby incorporated by reference herein.

FIELD OF THE INVENTION

The invention relates to an RF volume resonator system comprising a multi-port RF volume resonator, like e.g. a TEM volume resonator, or a birdcage coil, or a slot-line or other coupled delay structure, all of those especially in the form of a local coil like a head coil, or a whole body coil, and a plurality of transmit channels and/or receive channels for operating the multi-port RF volume resonator for transmitting RF excitation signals and/or for receiving MR relaxation signals into/from an examination object or a part thereof, respectively.

Further, the invention relates to an MR imaging system or scanner comprising such an RF volume resonator system, and to a method for MR imaging of an examination object by means of such an RF volume resonator system.

BACKGROUND OF THE INVENTION

In an MR imaging (MRI) system or MR scanner, an examination object, usually a patient, is exposed within the examination space of the MRI system to a uniform main magnetic field ($B_0$ field) so that the magnetic moments of the nuclei within the examination object tend to rotate around the axis of the applied $B_0$ field (Larmor precession) resulting in a certain net magnetization of all nuclei parallel to the $B_0$ field. The rate of precession is called Larmor frequency which is dependent on the specific physical characteristics of the involved nuclei and the strength of the applied $B_0$ field.

By transmitting an RF excitation pulse ($B_1$ field) which is orthogonal to the $B_0$ field, generated by means of an RF transmit antenna or coil, and matching the Larmor frequency of the nuclei of interest, the spins of the nuclei are excited and brought into phase, and a deflection of their net magnetization from the direction of the $B_0$ field is obtained, so that a transversal component in relation to the longitudinal component of the net magnetization is generated.

After termination of the RF excitation pulse, the relaxation processes of the longitudinal and transversal components of the net magnetization begin, until the net magnetization has returned to its equilibrium state. MR (relaxation) signals which are emitted during the relaxation processes, are detected by means of an RF/MR receive antenna or coil.

The received MR relaxation signals which are time-based amplitude signals, are Fourier transformed to frequency-based MR spectrum signals and processed for generating an MR image of the nuclei of interest within an examination object. In order to obtain a spatial selection of a slice or volume of interest within the examination object and a spatial encoding of the received MR relaxation signals emanating from a slice or volume of interest, gradient magnetic fields are superimposed on the $B_0$ field, having the same direction as the $B_0$ field, but having gradients in the orthogonal x-, y- and z-directions.

The above RF (transmit and/or receive) antennas can be provided both in the form of so-called body coils (also called whole body coils) which are fixedly mounted within an examination space of an MRI system for imaging a whole examination object, and as so-called surface or local coils which are arranged directly on or around a local zone or area to be examined and which are constructed e.g. in the form of flexible pads or sleeves or cages like head coils.

Further, such RF transmit and/or receive antennas can be realized on the one hand in the form of an RF antenna array or array coil, which comprises a number of coil elements which are individually selected for being driven by an RF current source in order to generate (and/or receive) their own local magnetic field such that a desired overall magnetic field distribution is generated within the examination space by all coil elements. However, this requires that the coil elements are decoupled from each other, or the mutual couplings (mainly due to magnetic flux) between the elements are compensated. On the other hand, an RF transmit and/or receive antenna can be realized in the form of an RF resonator, especially an RF volume resonator, which comprises a number of conductor elements which are electromagnetically coupled to each other such that by driving the RF resonator at one or two ports by an RF current source, a number of linearly independent resonant current distributions ("resonant modes") can be excited in the RF resonator for generating magnetic fields at certain resonance frequencies in a volume of interest (usually an examination space).

U.S. Pat. No. 7,285,957 discloses a multi-port RF birdcage coil assembly which comprises a coil structure having a number of coil elements extending between an inferior and a superior end-ring, wherein capacitors being connected with the end-rings, and a drive network being provided with multiple drive ports at the coil structure which are configured to drive the coil structure at more than two points on one of the end-rings with phase-shifted voltages at the same time such that an asymmetrical loading of the coil by a patient as a result of patient asymmetry is reduced and a substantially circular polarization of the field inside the coil structure is maintained. For eliminating standing waves on voltage cables leading to a power source, a balun network is provided, wherein each drive port is connected to a dedicated balun. Further, each balun is fed by a splitter network for receiving, splitting and phase-shifting a voltage input from the power source.

SUMMARY OF THE INVENTION

It has revealed that such a driving of a coil structure at two or more ports at the same time nevertheless has certain disadvantages especially as to an imperfect homogeneity of the generated RF field, the required RF power, the specific absorption rate (SAR) exposed to an examination object, and other, wherein all this is especially dependent on the physical properties like weight, fat and water content, extensions and other parameters of a certain examination object.

Further, such a coil structure usually employs a number of expensive discrete passive elements like capacitors for tuning the coil structure to be resonant at a resonant mode which generates a homogenous magnetic field in a desired volume and at a desired RF/MR resonant frequency, wherein such a tuning is a complex procedure. Finally, it has revealed that also the tuning can be disturbed by and can be dependent to a considerable degree on the physical properties like weight, fat and water content, extensions and other parameters of the examination object.

One object underlying the invention is to provide an RF volume resonator system such that a disturbance of an excited resonant mode at a desired RF/MR frequency (especially of its homogeneity), which is caused by introducing an examination object into the RF resonator, can be prevented or substantially decreased and is especially less or no longer dependent on different physical properties like weight, fat and water content, extensions or other parameters of an examination object.

This object is solved by an RF volume resonator system according to claim 1.

The multi-port RF volume resonator of the RF volume resonator system according to the invention can be realized in the form of a whole body resonator either for use in an open MRI system (vertical system) which comprises an examination zone, which is located between the ends of a vertical C-arm arrangement, or in an axial (horizontal) MRI system, which comprises a horizontally extending tubular or cylindrical examination space. Further, the RF volume resonator according to the invention can be realized in the form of a so-called surface or local resonator like a head coil etc. as explained above.

Further, both these multi-port RF volume resonators according to the invention can be realized in the form of a TEM-type or a birdcage coil-type resonator.

Finally, the principle of the invention can also be used in RF volume resonators for transmitting and/or for receiving RF signals for other applications than MR imaging.

The dependent claims disclose advantageous embodiments of the invention.

It will be appreciated that features of the invention are susceptible to being combined in any combination without departing from the scope of the invention as defined by the accompanying claims.

Further details, features and advantages of the invention will become apparent from the following description of preferred and exemplary embodiments of the invention which are given with reference to the drawings.

DETAILED DESCRIPTION OF EMBODIMENTS

Figure 1:
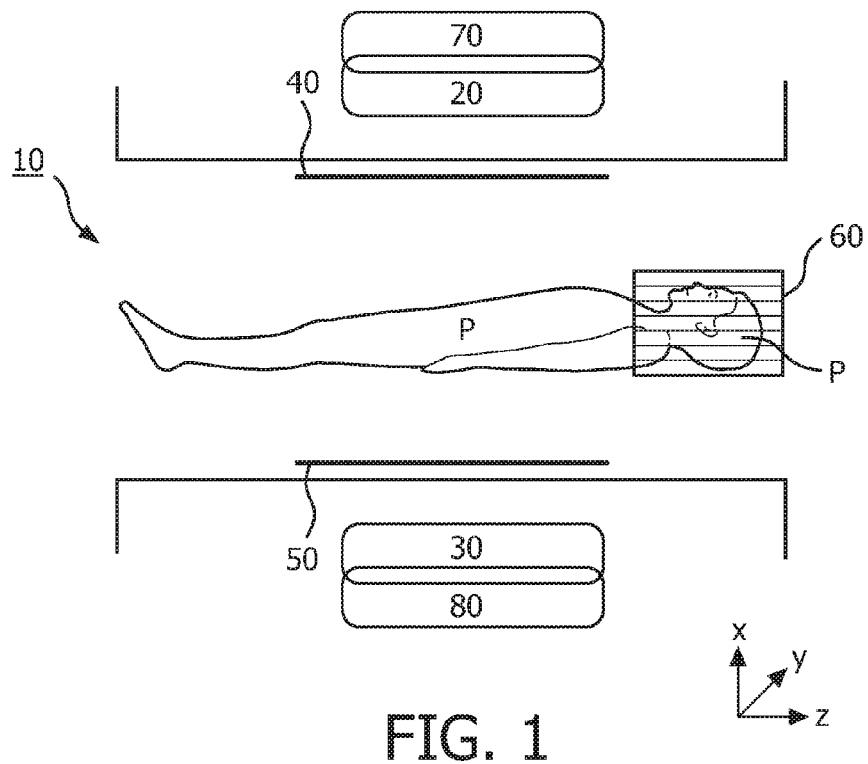
FIG. 1 shows a diagrammatic side elevation of an MRI system.

FIG. 1 shows substantial components of a magnetic resonance imaging (MRI) system or a magnetic resonance (MR) scanner. In this Figure, a vertical (open) system is shown having an examination zone 10 between an upper and a lower end of a C-arm structure.

Above and underneath the examination zone 10 there is provided in a known manner a first and a second main magnet system 20, 30, respectively, for generating an essentially uniform main magnetic field ($B_0$ field) for aligning the nuclear spins in the object to be examined. The main magnetic field essentially extends through a patient P in a direction perpendicular to the longitudinal axis of the patient P (that is, in the x direction).

A multi-port RF volume resonator serves for transmitting RF excitation pulses ($B_1$ field) at the MR frequencies and/or for receiving MR relaxation signals into/from a volume of interest and comprises according to FIG. 1 a first and a second planar RF antenna 40, 50 ("whole body coil"). Both RF antennas 40, 50 are provided in the form of each a planar and preferably a circular electrically conductive plate having at least substantially the same dimensions, wherein the plates are each electrically connected via capacitors to a ground potential in a known manner. The first planar RF antenna 40 is located according to FIG. 1 preferably at or on the first magnet system 20 and the second planar RF antenna 50 is located preferably at or on the second magnet system 30, wherein both plates are arranged parallel to each other and displaced from each other in the direction of the perpendicular projection to each other, delimiting the examination zone 10 of the MRI system between each other in the vertical direction.

In case of a horizontal (axial) MR imaging system in which a patient or another examination object is guided in an axial direction through a horizontal cylindrical or tubular examination space, instead of the RF volume resonator according to FIG. 1, usually a cylindrical RF volume resonator (especially of the birdcage- or TEM-type) is used. All of these kinds of whole body coils can be provided in the form of multi-port RF volume resonators according to the invention.

Further, a local multi-port RF volume resonator 60 ("local coil") can be provided which is shown in FIG. 1 exemplarily in the form of a head coil, preferably a birdcage coil (or a TEM coil), which is used usually in addition to the permanently built-in whole body RF volume resonator 40, 50, and which is arranged directly on or around a zone or specific region of interest of the object to be examined. Such local resonators can also be provided in the form of a multi-port RF volume resonator according to the invention.

For the spatial selection and spatial encoding of the received MR relaxation signals emanating from the nuclei, the MR imaging system is also provided with a plurality of gradient magnetic field coils 70, 80 by which three gradient magnetic fields in the orthogonal x-, y- and z-directions are generated as explained above.

Generally, the above and the following principles and embodiments are applicable both in case of an axial (horizontal) and a vertical (open) MRI system, both in case of a whole body coil and a local coil, and both in the form of a multi-port RF volume resonator comprising two planar RF antennas or a birdcage coil type or a TEM coil or another RF volume resonator.

Figure 2:
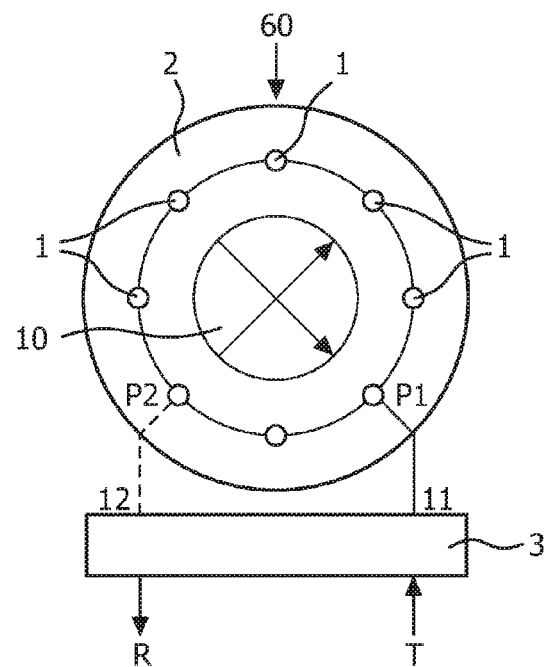
FIG. 2 shows a conventional two-port quadrature volume resonator in an axial view.

FIG. 2 shows a conventional two-port quadrature RF volume resonator 60 in the form of a birdcage coil in an axial view onto an end cap 2 of the coil 60. It comprises a plurality of conductor rungs 1 (the number N of which is usually even) which are arranged in a known manner at least substantially parallel to each other and are distributed with at least substantially equal distances from each other on and along the circumference of an at least substantially cylindrical surface which encloses an examination region 10. The conductor rungs 1 extend with their lengths at least substantially parallel to the axis of the coil 60. Each two neighboring conductor rungs 1 are usually connected to each other at both their axial ends by end conductors, which are usually realized each in the form of a conductor ring (end ring) like a circular loop conductor. Alternatively, the conductor rungs 1 can be connected at one of their ends by means of the indicated conducting end cup 2 and at their other ends by means of a conductor ring (not indicated).

Further, FIG. 2 shows a 90° coupler 3 which comprises an input T for applying an RF signal to be transmitted by means of the birdcage coil 60 and an output R for outputting an MR signal which is received by means of the birdcage coil 60. The coupler 3 comprises a first and a second terminal 11, 12 which are connected with a first and a second port P1, P2, respectively, of the birdcage coil 60 at each one of the rungs 1 of the birdcage coil 60, wherein these ports P1, P2 are geometrically displaced from one another by 90° in the circumferential direction of the birdcage coil 60 and are located in a common plane perpendicular to the longitudinal axis of the birdcage coil. The first and the second terminal 11, 12 of the coupler 3 is provided for applying and receiving, respectively, RF/MR signals which are (electrically) phase-shifted by 90° in relation to each other as generally known.

Assuming that the birdcage coil 60 is small in relation to the wavelength of the RF/MR signals to be transmitted and/or received, there are usually N/2+2 linearly independent current distributions available in the birdcage coil (wherein N is the number of rungs 1). These resonant current distributions can be described as the modes or eigenmodes of the birdcage coil, or, in other words, the birdcage coil shows N/2+2 resonances at different frequencies. Except for two end ring-modes in which substantially no currents flow in the rungs 1, there are N/2 relevant resonant frequencies which depend on the resonator proportioning and the type of the birdcage coil (i.e. low-pass, high-pass, band-pass). Usually, the resonant frequency of the first mode (or first order mode, k=1) is the one generating the best homogeneity of the magnetic field in the area enclosed by the birdcage coil (examination region 10) so that this mode is used for MR imaging. As generally known, a circularly polarized magnetic field can be generated by driving the birdcage coil at two spatial positions which are displaced by 90° to one another.

It has revealed that for feeding such an RF volume resonator with RF currents for exciting said resonant mode, i.e. for transmitting said RF excitation signals (and/or for coupling out RF currents which are induced in the RF volume resonator by the above MR relaxation events), in principal any two rung positions or end-ring positions which are located in a 90° geometrical distance from each other in the circumferential direction can be used as excitation positions (also called "antenna ports" or "ports" P1, P2, . . . ) of the RF volume resonator 60. In other words, an RF current is flowing in substantially every conductor of the RF volume resonator regardless of the certain (especially two) ports or excitation positions selected. By this, and in contrary to the above antenna arrays, a homogeneous RF field distribution can usually be generated without the necessity to feed the RF volume resonator at more than two ports simultaneously.

According to the invention, a multi-port RF volume resonator 60 (or RF volume resonator) comprising more than two ports is used. These ports can be distributed regularly or irregularly (i.e. the distances of adjacent ports from each other are the same or different) in the circumferential direction of the RF volume resonator. Preferably, each of these ports is connected with an own RF/MR transmit and/or receive channel, so that the number of RF/MR transmit and/or receive channels is equal to the number of ports.

A transmit channel and a receive channel each comprises a matching network, preferably in the form of a passive matching network, which is provided for matching the related port of the RF volume resonator to the optimum impedance of the connected power amplifier (in case of a transmit channel) or of the connected low noise amplifier (in case of a receive channel), and an ON/OFF switch for activating and deactivating the related port of the RF volume resonator.

In case that the multi-port RF volume resonator and especially at least one of the ports of the resonator is used both for transmitting and receiving RF/MR signals, the related RF/MR transmit and receive channel additionally comprises a transmit/receive switch, wherein the ON/OFF switch and the transmit/receive switch are preferably realized as a common switch unit. Alternatively, the transmit/receive switch is connected between the ON/OFF switch and the related matching networks for transmitting and receiving, or a common matching network is used both for transmitting and receiving, wherein in this case the matching network can be connected between the ON/OFF switch and the transmit/receive switch as indicated in FIGS. 5 to 10 (see below). Further, the matching network and the ON/OFF switch can also be combined to a common unit as will be exemplarily explained with reference to FIG. 11. All this accordingly applies for and can be realized in all embodiments shown in FIGS. 3 to 8.

Preferably, the ON/OFF switch is connected between the related port of the RF resonator and the matching network. This has the advantage, that in case a certain port of the multi-port RF volume resonator is not used for transmitting RF signals or for receiving MR signals, the resonant modes of the RF volume resonator are not influenced by the connected matching network or other components of the related transmit and/or receive channel at the not-used port. However, if the matching network is connected between the related port of the RF resonator and the ON/OFF switch, the tuning of the RF resonator has to be changed and adapted according to the reactance of the matching network.

In all the above cases, one or all of the RF/MR transmit and/or receive channels can comprise further components like for example a balun and/or an own power amplifier and/or an own low noise amplifier, as well as electronic components for controlling the amplitude, the phase, the pulse shape and/or the frequency of the transmitted RF signals, and/or electronic components for processing the received MR signals, respectively.

The above ON/OFF switches each comprise a control input for switching the switch between a conducting and a non-conducting state, so that the other components of the related RF/MR transmit and/or receive channel are connected with and disconnected from the related port, respectively, and by this the related port is activated and deactivated, respectively.

Preferably, all ON/OFF switches are controlled by a common control unit which preferably includes a programmable computer program by means of which the switches are selected and switched between the on and the off state especially in dependence on certain physical properties of an examination object as explained in more details below. Preferably, the control unit is also provided for operating any existing transmit/receive switches, if necessary. A related computer program can be adapted to be downloaded to a control unit C of an RF volume resonator system or an MR imaging system or scanner, when run on a computer which is connected to the Internet.

Figure 3:
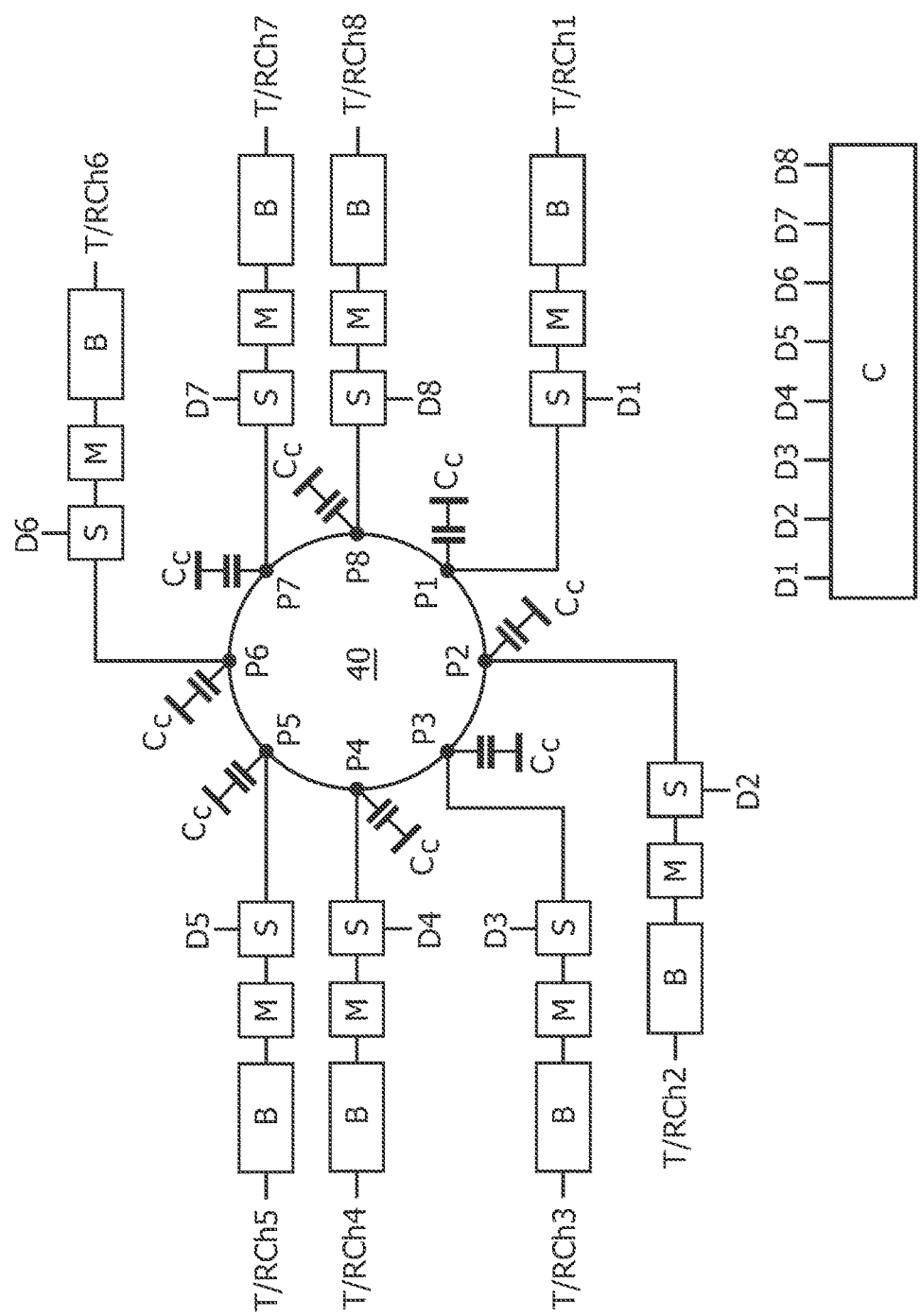
FIG. 3 shows a first embodiment of an RF volume resonator system according to the invention.

FIG. 3 schematically shows a first embodiment of substantial components of such an RF volume resonator system according to the invention. It comprises a multi-port RF volume resonator preferably comprising a first and a second planar multi-port RF antenna 40, 50 each in the form of a planar electrically conductive plate (only the first planar RF antenna 40 is shown) with a plurality of ports P1, ... Pn with which each a transmit or receive channel T/RCh is connected.

The first (and the second) planar multi-port RF antenna 40 is/are preferably provided in the form of each a circular plate which is connected via capacitors Cc to a ground potential in a known manner. The plate can also have an oval or a polyangular or another shape. Along the circumference of the plate, the ports P1, ... P8 are located, wherein in case of the embodiment shown in FIG. 3 adjacent ports have the same distances in the circumferential direction from each other. However, as mentioned above, these distances can also be different.

Each port P1, P2, ... P8 is connected by means of an ON/OFF switch S as explained above with other components of an RF/MR transmit or receive channel T/RCh1, T/RCh2, ... T/RCh8 for operating the RF resonator for transmitting or receiving RF/MR signals. FIG. 3 indicates exemplary such components, namely a matching network M and a balun B, wherein the matching network M is connected between the ON/OFF switch S and the balun B in a known manner.

Either all these channels are transmit channels or all these channels are receive channels or some ports are each connected with a transmit channel and other ports are each connected with a receive channel, e.g. in an alternating manner along the circumference of the plate, wherein the number of transmit channels and the number of receive channels can be equal or different. All this applies for all other embodiments accordingly.

The ON/OFF switches S are each connected between the related port P and the other components of the related transmit or receive channel T/RCh and can be switched between an ON and an OFF state independently from each other by means of each an individual switch signal D1, D2, ... D8, wherein these switch signals are generated by means of a control unit C. In the ON state, the related port is activated and the related other components of the transmit or receive channel are connected with the related port, and in the OFF state the port is deactivated and is disconnected from the related other components of the transmit or receive channel.

An RF volume resonator according to the invention preferably comprises two planar multi-port RF antennas 40 (50) as indicated in FIG. 3, wherein in this case the two plates are arranged in parallel to each other and are displaced in the direction of a perpendicular projection to each other as indicated in FIG. 1 for the first and the second planar RF antenna 40, 50. The two plates preferably have the same shape and dimensions, preferably including the same number and arrangement of ports wherein the plates are preferably arranged such that the ports of one plate are displaced in a direction perpendicular to the plate from the ports of the other plate. Further, the ports of both plates are connected with transmit or receive channels which are distributed among the ports of both plates in the same or different ways. However, it could also be possible to provide the two plates with different shapes and/or dimensions, and/or to provide only one of the plates with ports P1, ... Pn or both plates with different numbers of ports and related transmit or receive channels.

The transmit or receive channels T/RCh1, T/RCh2, ... T/RCh8 are preferably controllable independently from each other with respect to the adjustment of at least one of the amplitude, the pulse shape, the frequency and the phase of the generated RF transmit signals or with respect to the related processing of the received RF signals, respectively.

The generation of the switch signals D1, D2, ... D8 by means of the control unit C, and by this the selection of the ports P1, P2, ... Pn to be connected and disconnected with/from the related transmit or receive channel T/RCh1, T/RCh2, ... T/RCh8, as well as the adjustment of at least one of the above parameters of the generated or received RF/MR signals, is conducted especially in dependence on certain physical properties of a certain examination object which is to be imaged and the geometric distances of the selected activated ports from each other.

Preferably, always two ports are selected and activated at the same time by the control unit C by switching the related two switches S into the ON state and the other switches S into the OFF state. In order to provide a great flexibility for selecting the appropriate two (or more) ports, the volume resonator comprises a total number of ports which is greater than the maximum number of ports which are selected and activated by the control unit C at the same time for connecting the same with the related transmit and/or receive channel. This also applies for all other embodiments shown in FIGS. 4 to 8.

By this, several MR images can sequentially be generated on the basis of each a selection of each different one or more (preferably each two) transmit or receive channels T/RCh1, T/RCh2, ... T/RCh8 and/or of different adjustments of the above RF signal parameters in order to select the image having the best image quality. This applies for all embodiments of the RF volume resonator system.

Figure 4:
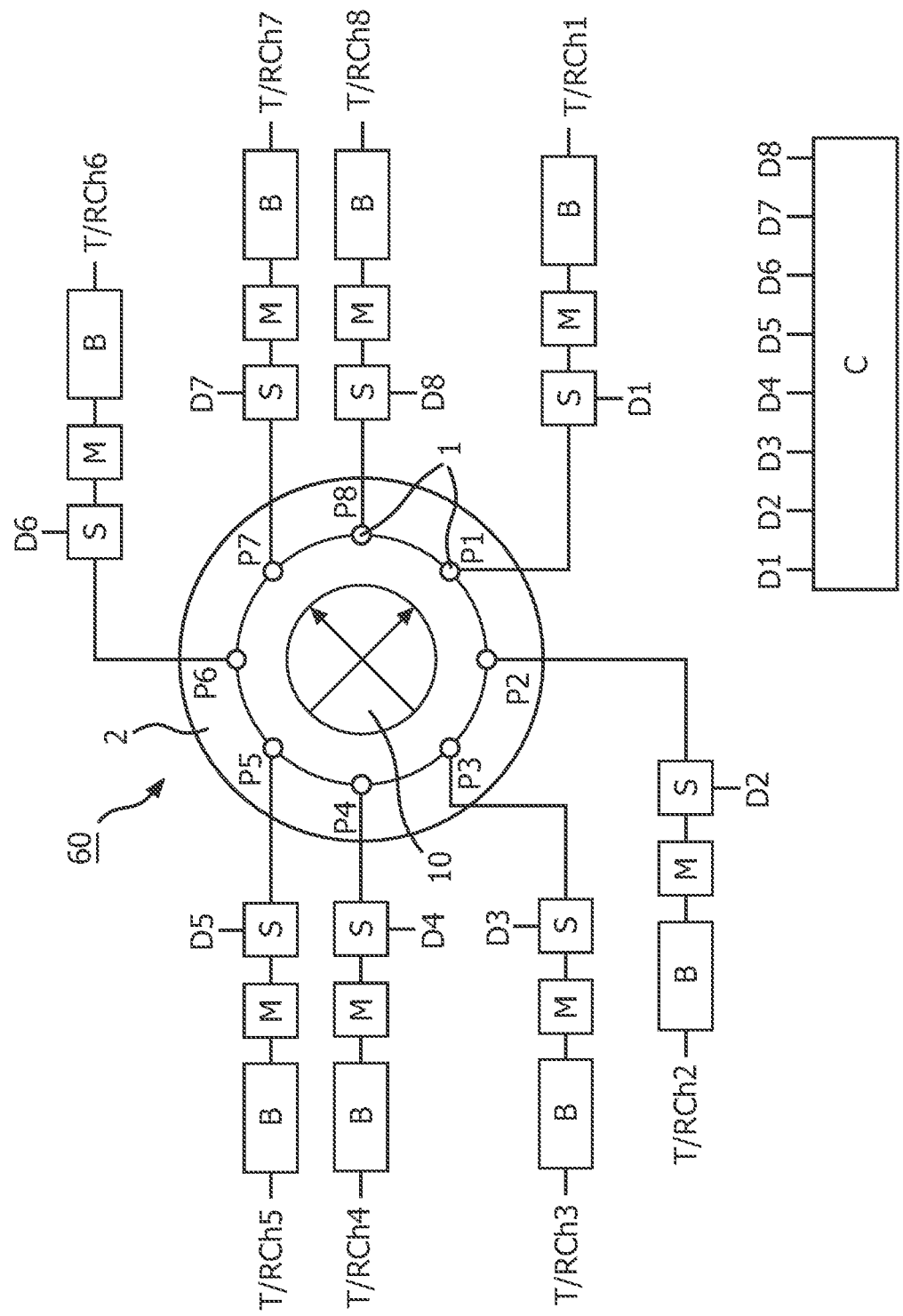
FIG. 4 shows a second embodiment of an RF volume resonator system according to the invention.

FIG. 4 schematically shows a second embodiment of an RF volume resonator system according to the invention. Substantially, only the differences to the first embodiment shall be explained in the following.

The RF volume resonator system comprises a multi-port RF volume resonator 60 according to a second exemplary embodiment in the form of a birdcage coil in an axial view onto an end cap of the birdcage coil 60. The rungs 1 are preferably regularly distributed along the circumference of the coil and are geometrically displaced according to the exemplary embodiment in FIG. 4 in the circumferential direction by each 45°, so that in total eight rungs 1 are provided around the circumference of the coil. Of course also another number N of rungs 1 can be provided, e.g. 12 rungs 1, which if regularly distributed are each displaced by 30° in the circumferential direction etc. However, it is not necessary that the rungs 1 are regularly distributed and have equal angular displacements to each other in the said circumferential direction of the coil. Instead, each adjacent rungs 1 can also have different geometric displacements from each other.

The rungs 1 are each provided with at least one port P1, P2, ... Pn at a position along the length of each rung 1, wherein preferably all ports are located at the same position along the length of the rungs 1. However, the ports can also be located at different positions along the length of the rungs 1. Of course further rungs 1 without a port can be provided e.g. between those rungs 1 which are provided with a port. Additionally or alternatively, one or more ports of the RF resonator 60 can also be provided and distributed along the length of at least one of the two axial end conductors which connect the rungs 1 with each other at their axial ends.

Again, each port of the RF resonator 60 is connected with an ON/OFF switch S of an own transmit or receive channel T/RCh1, ... T/RCh8 as explained above with reference to FIG. 3. Each channel exemplarily further comprises according to FIGS. 3 and 4 a series connection of a matching circuit M, an optional balun B and preferably other transmit or receive units (not shown) for generating an RF signal to be fed to the port or for processing a received MR signal, in order to excite and receive, respectively, a resonant mode as explained above. Further, especially in case of transmission, an RF transmit signal can have an arbitrary shape, like e.g. in case of a three-dimensional RF pulse, for locally exciting a certain region or volume (SENSE technology) instead of the above mentioned homogenous resonant mode.

Again, all ON/OFF switches S can be switched for transmitting RF excitation signals and for receiving MR relaxation signals between an ON and an OFF state independently from each other by means of each an own switch signal D1, D2, ... D8, generated by the control unit C, for connecting and disconnecting the related port P by means of the related switch S with/from the other components of the related transmit or receive channel T/RCh as explained above.

The matching circuits M are again provided for matching or transforming the impedance at the related port P of the resonator with the optional balun B or, if no balun is present, with the related other components of the transmit or receive channel T/RCh.

The optional baluns B are used as usual e.g. for eliminating standing waves on the cables which are connected with the related matching circuit M.

Figure 5:
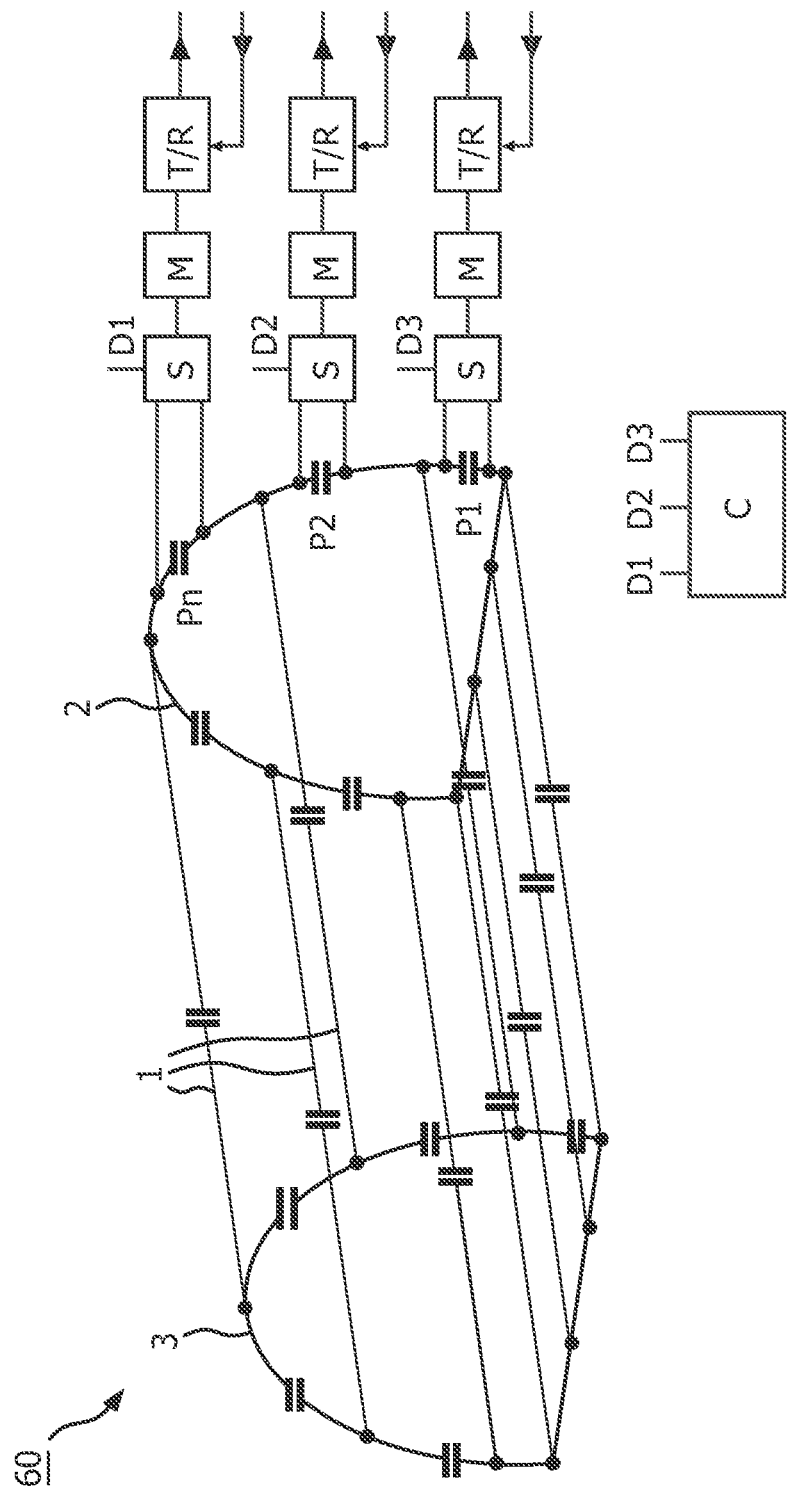
FIG. 5 shows a schematic three-dimensional view a third embodiment of an RF volume resonator system comprising a multi-port birdcage coil according to the invention.

FIG. 5 shows a schematic three-dimensional view of a third embodiment of an RF volume resonator system comprising a multi-port birdcage coil 60. Again, substantially only the differences to the second embodiment shall be explained in the following.

The birdcage coil 60 comprises a plurality of rungs 1 which extend as explained above in the axial direction of the birdcage coil and which are connected to each other at both their axial ends by means of a first and a second end conductor 2, 3, respectively. The three ports P1, P2, Pn of the resonator which are exemplarily indicated in FIG. 5, are arranged at and along the first end conductor 2, wherein further such ports can be provided at the first and/or at the second end conductor 2, 3 and/or at one or more of the rungs 1, irrespectively of the indicated shape of the cross section of the resonator. Again, a control unit C is schematically indicated for generating the switch signals D1, D2, D3 for opening and closing the switches S.

This embodiment of the birdcage coil exemplarily comprises a flat plane which is preferably provided for placing an examination object thereon. However, other shapes of the cross section can also be provided.

Figure 6:
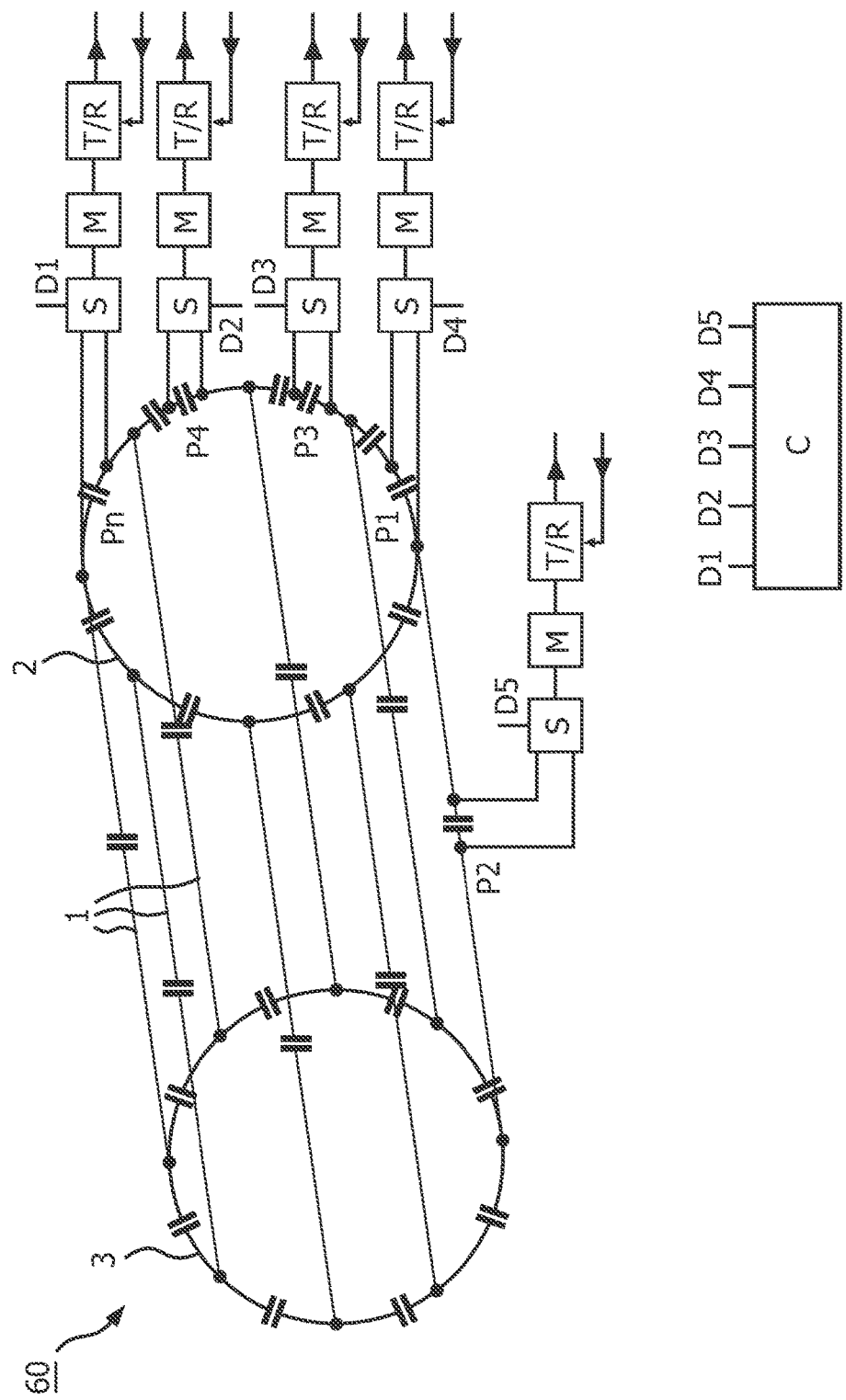
FIG. 6 shows a schematic three-dimensional view of a fourth embodiment of an RF volume resonator system comprising a multi-port birdcage coil according to the invention.

FIG. 6 shows a schematic three-dimensional view of a fourth embodiment of an RF volume resonator system, again comprising a multi-port birdcage coil 60, which has an at least substantially circular cross section. Further, additionally to the ports P1, P3, P4 and Pn which are arranged at and along the first end conductor 2, one port P2 is exemplarily indicated at one of the rungs 1 of the birdcage coil.

In contrary to the embodiments shown in FIGS. 3 and 4, the third and fourth embodiment of the RF volume resonator system according to FIGS. 5 and 6, respectively, is provided with transmit and receive channels at each port P1, ... Pn. For connecting each port either with a power amplifier for transmitting RF signals or with a low noise amplifier for processing received MR signals, each a transmit/receive switch T/R is provided which is connected exemplarily between the matching circuit M and the related amplifiers. However, also the embodiments shown in FIGS. 3 and 4 can be provided with such transmit/receive switches T/R for operating the multi-port RF volume resonator 40, 50; 60 for transmitting and receiving as explained above.

Again, both FIGS. 5 and 6 show that each port P1, ... Pn is connected by means of a switch S with the related transmit and receive channel. Regarding the switching of the switches S by means of switch signals D1, D2, ... Dn, which are generated by the control unit C, and the parameters of the RF/MR transmit/receive signals at the individual transmit and receive channels, reference is made to the above explanations.

Finally, in the indicated case of a band-pass-type birdcage coil, the rungs 1 and the first and the second end conductor 2, 3 comprise capacitors (not denoted) which are serially connected into the rungs 1 and the end conductors 2, 3, respectively, for tuning the resonant modes of the RF volume resonator as generally known. However, the principles of the invention are applicable also in case of a low-pass-type birdcage coil (tuning capacitors only in the rungs) and a high-pass-type birdcage coil (tuning capacitors only in the end conductors).

Figure 7:
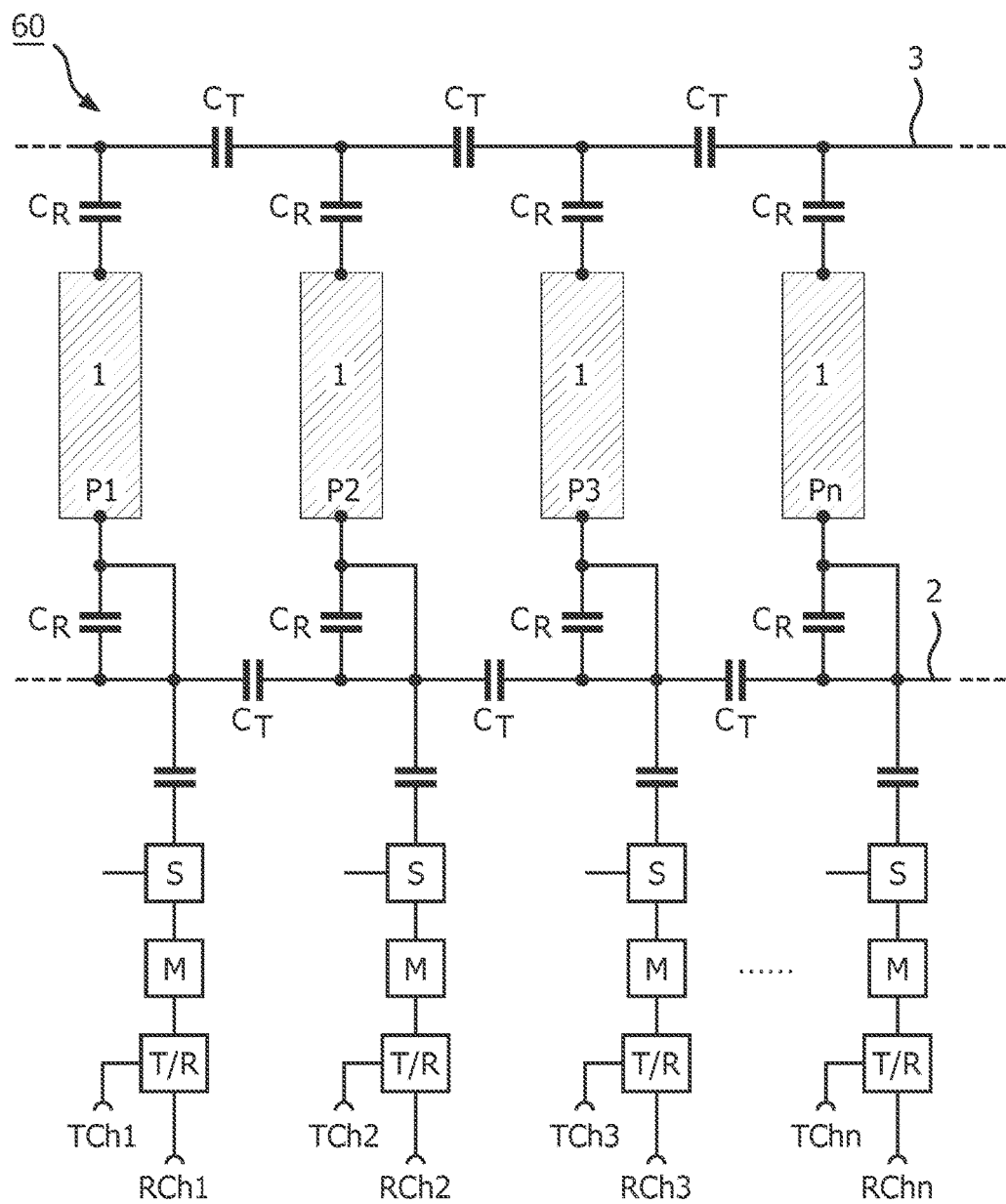
FIG. 7 shows a fifth embodiment of an RF volume resonator system comprising a multi-port planar coil, or a birdcage coil unrolled into a two-dimensional plane according to the invention.

FIG. 7 shows a fifth embodiment of an RF volume resonator system. Substantially, only the differences to the above embodiments shall be explained.

This RF resonator system comprises a multi-port RF resonator according to the invention in the form of a birdcage coil which instead of the rungs as indicated in FIGS. 5 and 6 is provided with strip lines 1 as defined above. FIG. 7 shows a part of a related conductor structure 60 schematically unrolled into the two dimensional plane.

Further, FIG. 7 schematically indicates the first and the second end conductor 2, 3 between which the strip lines 1 extend. The strip lines 1 are coupled at both their ends by means of coupling capacitors $C_R$ to the first and the second end conductor 2, 3, respectively. Further, the end conductors 2, 3 comprise capacitors $C_T$ which are serially connected into the end conductors 2, 3 for tuning the spectrum of the resonant modes of the RF coil as generally known.

Preferably at one of the ends of each strip line 1 each a port P1, P2, . . . Pn of the RF coil is provided. Again, each port is connected via a switch S with a transmit and receive channel TCh/RCh, each indicated again in the form of a series connection of a matching circuit M and a transmit/receive switch T/R as explained above with respect to FIGS. 5 and 6. The control unit C for generating the switch signals D1, . . . Dn for switching the switches S is not indicated in FIGS. 7 and 8 for the sake of clarity only.

Alternatively, the conductor structure according to FIG. 7 also represents a part of a planar multi-port RF antenna according to the invention, similarly to FIG. 3. In this case, an RF resonator can be provided by two such planar antennas which are arranged in parallel to each other and are displaced in the direction of a perpendicular projection to each other as indicated in FIG. 1 and as explained in connection with FIG. 3, wherein preferably the planar antennas are arranged such that the strip lines of one of the antennas extend with an angle of 90° to the strip lines of the other antenna. Regarding the distribution of transmit or receive channels among the ports, reference is made to the explanations in connection with FIG. 3.

Figure 8:
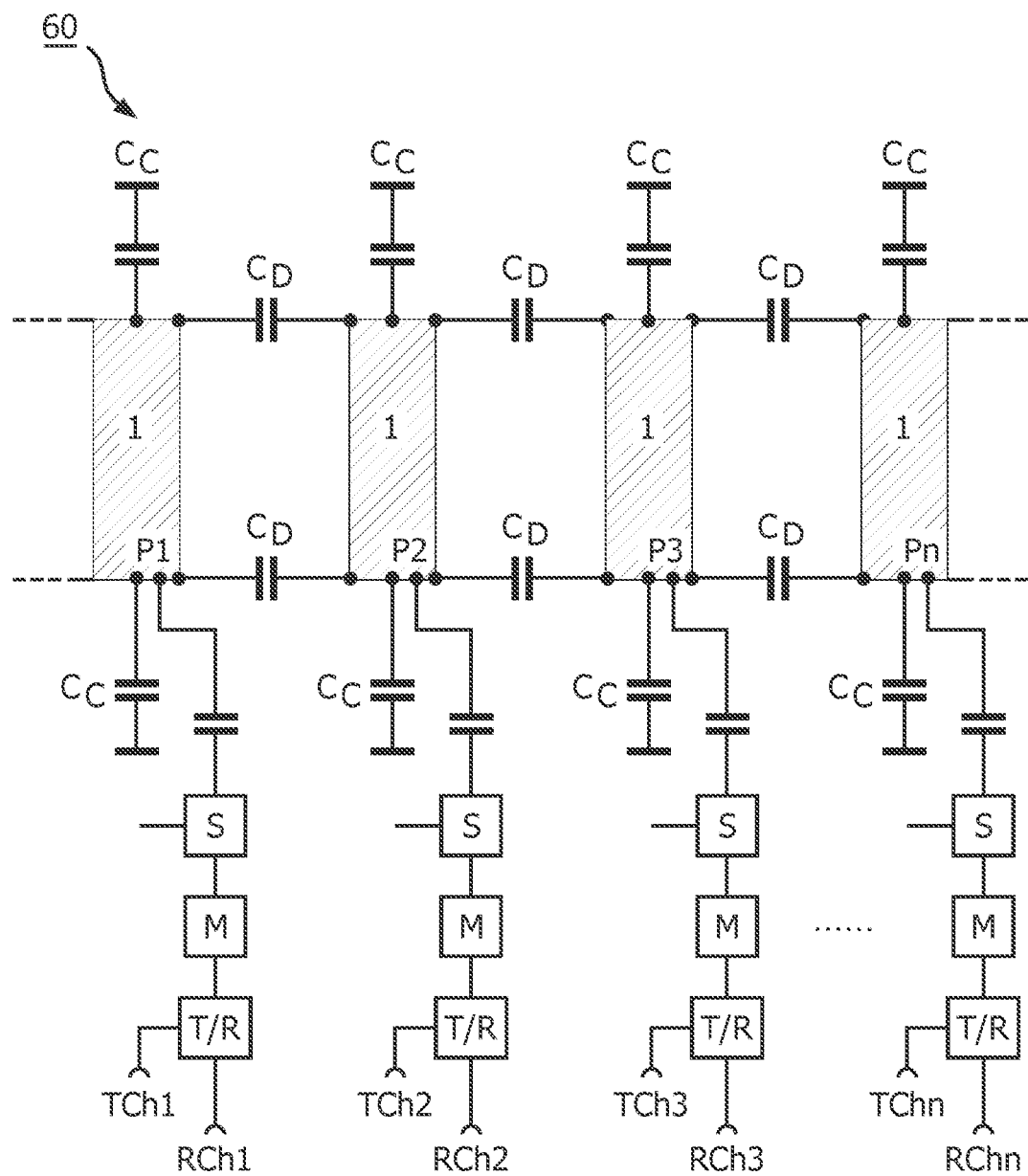
FIG. 8 shows a sixth embodiment of an RF volume resonator system comprising a multi-port planar TEM coil, or a cylindrical TEM coil unrolled into a two-dimensional plane according to the invention.

FIG. 8 shows a sixth embodiment of an RF volume resonator system. Substantially, only the differences to the above fifth embodiment shall be explained. It comprising a multi-port RF resonator according to the invention in the form of a TEM resonator, which comprises strip lines 1 which are coupled as generally known at both their ends by means of coupling capacitors Cc to an RF screen (not shown). FIG. 8 shows a part of the conductor structure 60 of an at least substantially cylindrical TEM resonator, schematically unrolled into the two dimensional plane.

The strip lines 1 are coupled to each other at both their ends by means of tuning capacitors $C_D$, by means of which a desired spectrum of resonant modes of the TEM resonator is tuned. Finally, preferably at each one of the ends of the strip lines 1 again each one port P1, P2, . . . Pn of the TEM resonator is located. With each port, again a transmit and receive channel TCh/RCh is connected via an ON/OFF switch S, which transmit/receive channels exemplarily each comprise a series connection of a matching circuit M and a transmit/receive switch T/R as explained above.

Again, the conductor structure according to FIG. 8 alternatively also represents a part of a planar (i.e. two-dimensional) multi-port TEM coil according to the invention. In this case, an RF resonator can be provided by two such TEM coils which are arranged in parallel to each other and are displaced in the direction of a perpendicular projection to each other as indicated in FIG. 1 and as explained in connection with FIG. 3. Further, reference is made to the above explanations.

Figure 9:
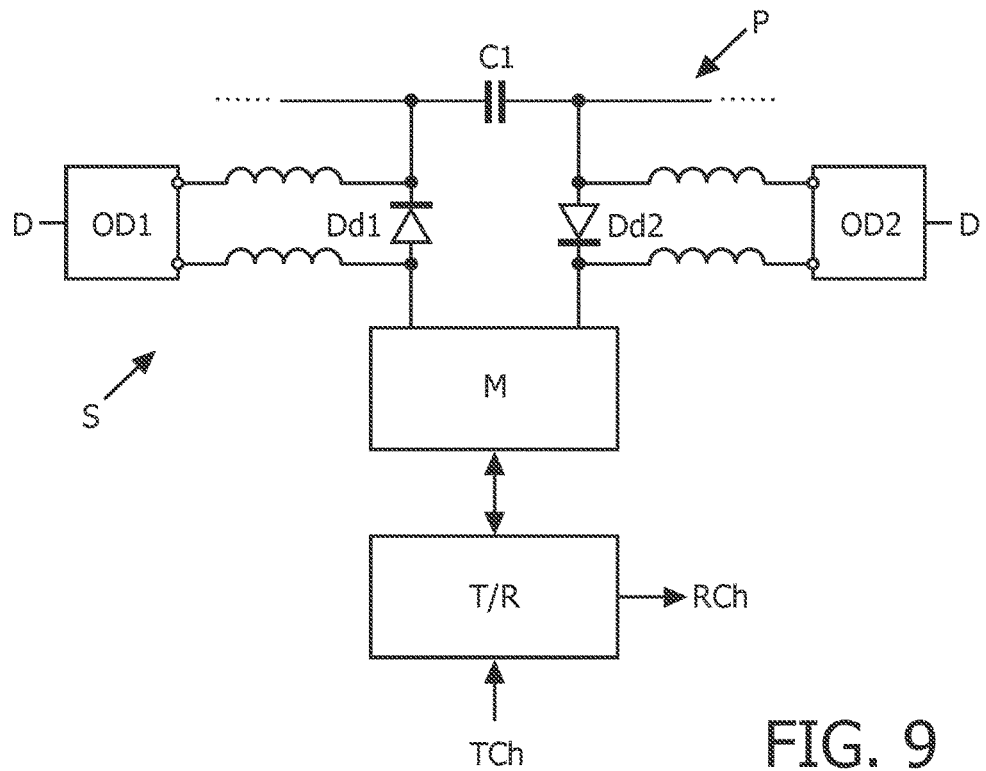
FIG. 9 shows a first embodiment of a switch arrangement for connecting and disconnecting a transmit and receive channel to/from a port of a multi-port coil.

FIG. 9 shows more in detail a first embodiment of a switch arrangement comprising an ON/OFF switch S, a matching circuit M and a transmit/receive switch T/R as explained above. The ON/OFF switch S is provided for connecting and disconnecting, respectively, a port of a multi-port RF resonator to/from a transmit channel TCh and/or a receive channel RCh, respectively.

According to FIG. 9, the ON/OFF switch S exemplarily comprises a first and a second diode Dd1, Dd2, which are especially PIN diodes, and which are connected in series into each one connection line between the matching circuit M, i.e. the transmit/receive channel TCh/RCh, and the related port P of the RF resonator, wherein both diodes Dd1, Dd2 are connected with their poles in opposite directions to each other. Further, the ON/OFF switch S comprises a first and a second bias voltage source OD1, OD2 which are each connected in parallel to the first and the second diode Dd1, Dd2, respectively, for biasing the first and the second diode Dd1, Dd2, respectively, preferably via inductive elements, conductive or non-conductive. The bias voltage sources OD1, OD2 are switched each by means of a switch signal D which is applied at an input of the bias voltage sources and which is generated by means of the control unit C as explained above with reference to FIGS. 3 to 6.

The bias voltage sources OD1, OD2 are generally known as such in a variety of embodiments. Preferably, bias voltage sources OD1, OD2 are used which can be switched for biasing the diodes Dd1, Dd2 by means of optical switch signals which are submitted by means of fiber optics from the control unit C to the bias voltage sources OD1, OD2.

By biasing the diodes Dd1, Dd2 conductive, the related transmit/receive channel TCh/RCh is connected with the related port P of the RF resonator, and by biasing the diodes Dd1, Dd2 non-conductive, the related transmit/receive channel TCh/RCh is disconnected from the related port P of the RF resonator.

Figure 10:
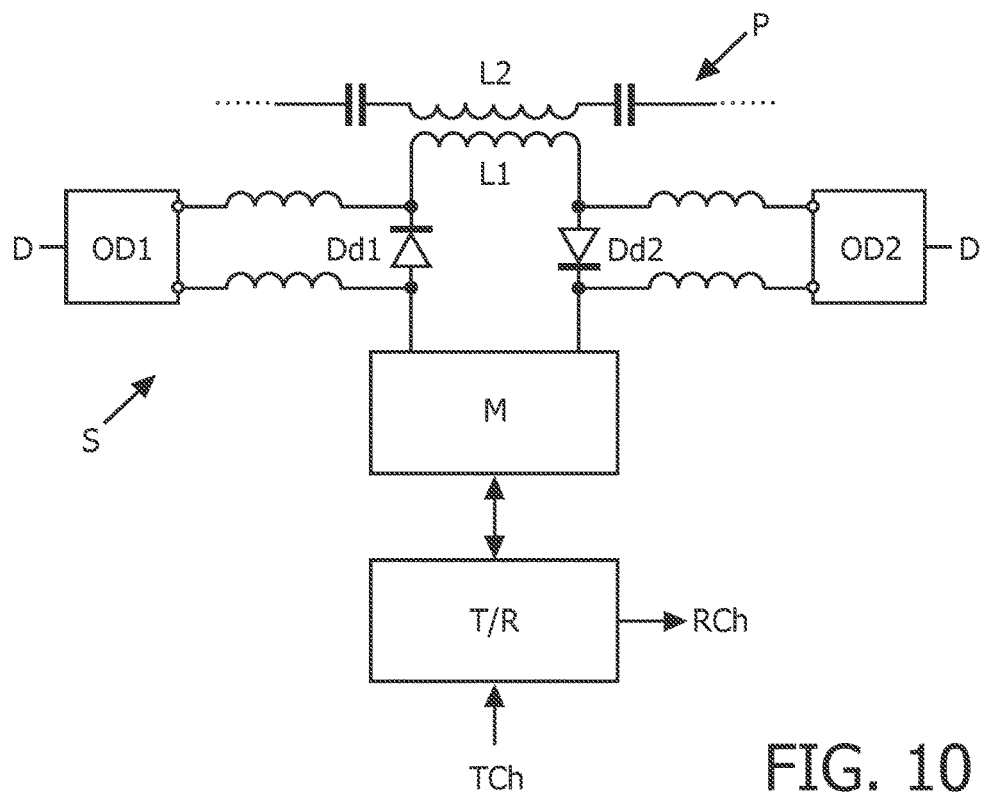
FIG. 10 shows a second embodiment of a switch arrangement for connecting and disconnecting a transmit and receive channel to/from a port of a multi-port coil.

FIG. 10 shows a second embodiment of a switch arrangement comprising an ON/OFF a switch S for connecting and disconnecting, respectively, a port P of a multi-port RF resonator to/from a transmit channel TCh and/or a receive channel RCh, respectively. Further, a transmit/receive switch T/R as explained above is shown.

The difference between this second embodiment and the first embodiment according to FIG. 9 is, that the port P remains galvanically separated from the ON/OFF switch S and by this from the transmit and/or receive channel TCh/RCh, but is inductively coupled to the same by means of a first and a second inductive element L1, L2. Especially in this second embodiment but also in the above first embodiment, instead of the two diodes Dd1, Dd2, a switching can also be conducted by means of only one of these diodes if the other diode is replaced by a conducting wire and the related bias voltage source is omitted.

Figure 11:
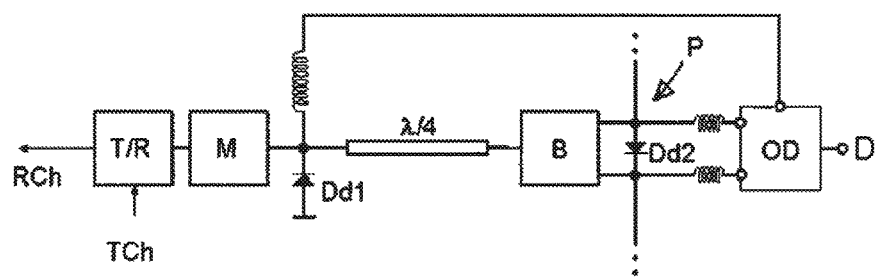
FIG. 11 shows a third embodiment of a switch arrangement for connecting and disconnecting a transmit and receive channel to/from a port of a multi-port coil.

FIG. 11 shows a third embodiment of a switch arrangement comprising an ON/OFF switch which comprises a $\lambda/4$ line, a first and a second diode Dd1, Dd2, a balun B and a bias voltage source OD for biasing the first and the second diode via inductive elements and by means of a switch signal D (again especially an optical switch signal as explained above) conductive or non-conductive. A first end of the $\lambda/4$ line can be connected to ground by means of the first diode Dd1 when biasing this diode conductive. The opposite second end of the $\lambda/4$ line is connected via the balun B with a port P of the multi-port RF volume resonator. In case of a birdcage coil, this port P is preferably located at a rung of the birdcage coil and preferably at a position at half the length of the rung, into which the second diode Dd2 is serially connected. In order to activate this port P, the first and the second diodes Dd1, Dd2 are biased non-conductive, whereas for deactivating this port P, both diodes Dd1, Dd2 are biased conductive. Further, according to FIG. 11, the first end of the $\lambda/4$ line is connected with a matching circuit M which itself is connected with a transmit/receive switch T/R as indicated in FIGS. 9 and 10.

Figure 12:
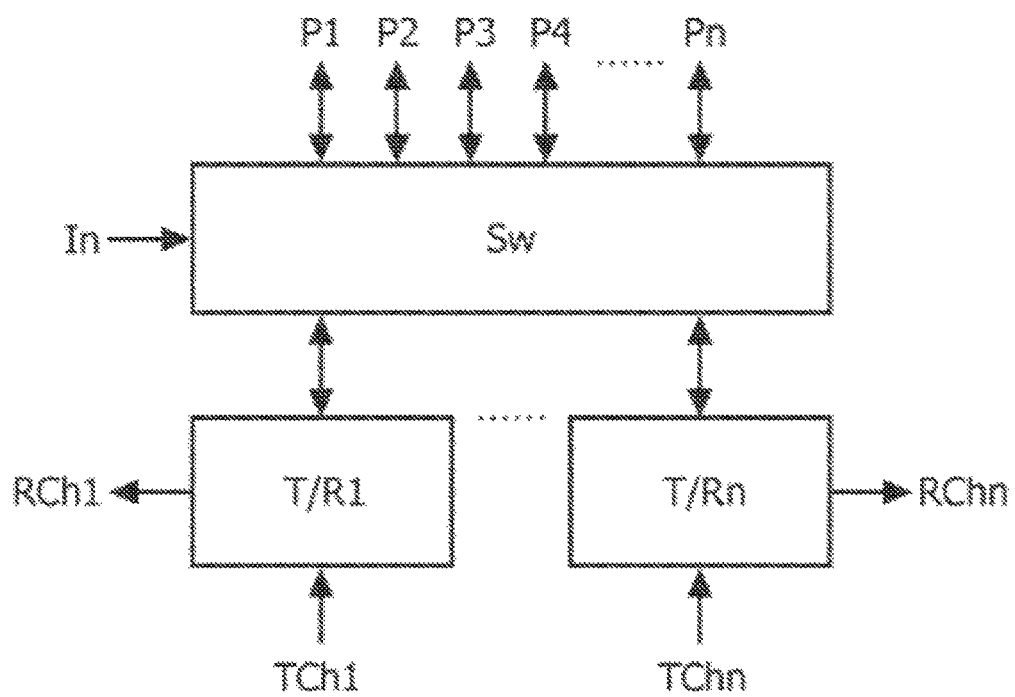
FIG. 12 shows a switch matrix for selecting and operating the switches.

FIG. 12 shows an exemplary switch matrix Sw for selecting and operating the port or ports P1, . . . Pn of a multi-port RF resonator. The switch matrix Sw includes for example the switches S, the control unit C and the matching circuits M according to FIGS. 3 to 8 for all ports of the RF resonator.

Further, the switch matrix exemplarily comprises an input terminal In for feeding in actual physical parameters of a certain examination object and a plurality of first input/output terminals which are each to be connected with each one of the ports P1, P2, . . . Pn of the RF volume resonator 60, and a plurality of second input/output terminals which are each to be connected with each one of the transmit/receive switches T/R1, . . . T/Rn of the transmit and receive channels TCh1/RCh1, . . . TChn/RChn.

The switch matrix Sw preferably includes a computer program for generating the switch signals D for the switches S (and by this for connecting and disconnecting, respectively, the related transmit/receive channels TCh1/RCh1, . . . TChn/RChn with/from the selected ports P1, . . . Pn) on the basis of the fed-in parameters of the examination object, as explained in more details with reference to FIG. 13 below.

The RF volume resonator system according to the invention has a number of advantages. By the possibility of a free selection of the input port or the input ports of the RF resonator, a more homogenous resonant mode can be obtained within an examination space for examination objects having very different physical properties. Further, a more equal RF power distribution at the input ports is obtained, and an RF shimming purely via phase variation (single amplifier, powers splitter and one phase shifter instead of two individual amplifiers) is enabled. Further, also because of the more equal power distribution of the RF power at the ports, an increased parameter space for SAR (specific absorption rate) of an examination object is obtained. These advantages can be obtained even in case of elliptically or other designed RF resonators as mentioned above. Preferably, always a pair of two ports is selected for activation at the same time in order to realize these advantages, while the other ports are deactivated. The geometric displacement of the two ports of such a pair in relation to each other along the circumference of the RF resonator and the phase shift between the RF currents feeding these two ports is preferably selected and controlled, respectively, as generally known such that a circularly polarized magnetic RF/MR field is generated (and accordingly received). This preferably applies for all embodiments of the multi-port RF resonators as exemplarily shown in FIGS. 3 to 8.

Figure 13:
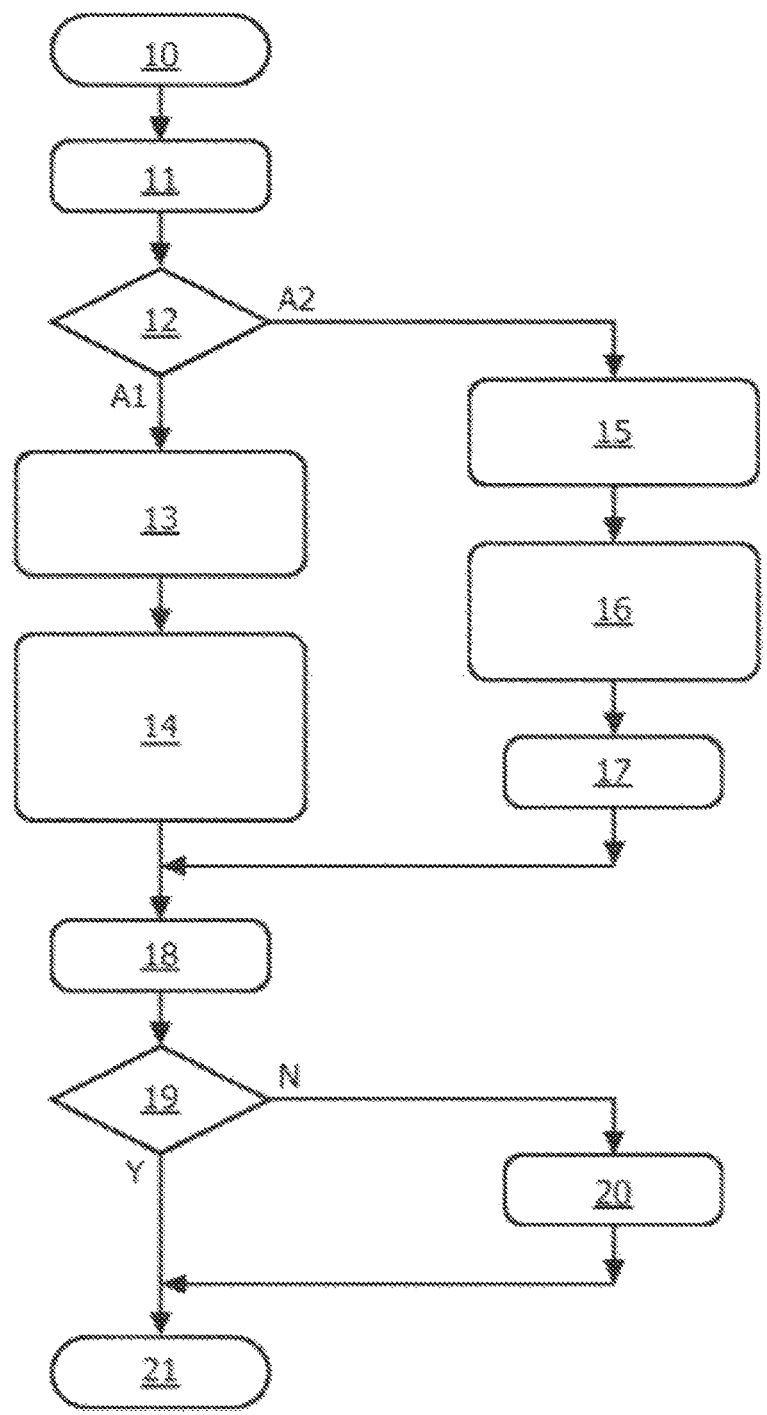
FIG. 13 shows a flow chart of a method for conducting an MRI scan by means of an RF resonator according to the invention.

FIG. 13 shows a flow chart of an exemplary method for conducting an MRI scan by means of an RF volume resonator system according to the invention. The method is preferably conducted by means of a computer program which is implemented in the control unit C according to FIGS. 3 to 5 or in the switch matrix Sw according to FIG. 12. Generally, before conducting a usual (i.e. "main") MR imaging of an actual examination object, preferably an MR imaging pre-scan of the examination object is conducted in order to achieve the optimal or highest homogeneity of the related resonant RF mode and/or the lowest SAR (specific absorption rate) for the actual examination object.

Accordingly, FIG. 13 shows that after a start of the method with a first step 10 (strt), the MRI pre-scan procedure is started with a second step 11 (pr sc). The operator can now select in a third step 12 between two alternatives, namely a first alternative which is conducted by steps 13 and 14, and a second alternative which is conducted by steps 15, 16 and 17. Then, the main MRI scan is started with step 18.

According to the first alternative, in step 13 (op in), a number of physical properties of the actual examination object are input by the operator as input parameters, like the volume, weight, size, water/fat ratio and/or other. In step 14 (LUT/Sel pts), these parameters serve as input for a look-up table, in which different models for different classes of examination objects are stored.

After the selection of the appropriate model which best corresponds with the input parameters and by this gives the best results as to a high homogeneity of the resonant RF mode and/or a low SAR value, the appropriate (especially two) ports and the values for amplitudes, frequencies, phases and/or pulse shapes of the RF currents for the related transmit/receive channels to be connected with these appropriate ports, (wherein the appropriate ports and these values are stored for each model in a storage, e.g. of the control unit) are red out from the storage and are applied during the main MRI scan in step 18 (scn).

The look-up table and the assignments of ports and of the above values of the RF currents to each model is/are established e.g. on the basis of experiments and electromagnetic simulations (especially using FEM or FDTD programs) using dielectric models of examination objects which are stored in the look-up table and having different values of the above and other physical parameters. The established look-up table and assignments are stored e.g. in the control unit C preferably prior to the first use of the RF volume resonator system.

According to the second alternative, in step 15 (sry scan) a mapping MR imaging sequence is conducted for a certain examination object by driving all of the ports of the RF resonator sequentially. The resulting image data are then used in step 16 (RF st) to calculate iteratively or by using a look-up table those amplitudes, frequencies, phases and/or pulse shapes of the RF currents for which at each of the ports the optimal or highest homogeneity of the related resonant mode and/or the lowest SAR value for the actual examination object is achieved. Then in step 17 (sel pts) a database is established containing for each port these optimal amplitudes, frequencies, phases and/or pulse shapes.

Then the main MRI scan is started in step 18 (scn) and each selected port is driven with the values for the amplitudes, frequencies, phases and/or pulse shapes of the RF currents which have been evaluated during one of the above pre-scans.

The ports can also be selected (i.e. the switches S are switched by means of the accordingly generated switch signals into the ON or the OFF state) according to a predetermined or desired sequence which is input by an operators into the control unit C. Alternatively, the ports can be selected automatically as evaluated above by means of the control unit C, also repeatedly, and on the basis of the said physical properties of the actual examination object such that the homogeneity of the resonant RF mode is a maximum and/or the value of the SAR is a minimum when conducting an MR imaging of an examination object, wherein generally the ports which are activated for transmitting RF signals can be different from those ports which are activated for receiving MR relaxation signals.

Preferably, a local (pick-up) coil or sensor coil is arranged at at least one of the ports of the RF resonator (not indicated in the Figures), wherein preferably all ports of the RF resonator are provided with such a local (pick-up) coil or sensor coil for sensing according to step 19 (SAR?) the strength of the local RF current or of the local RF field and for controlling the same by means of the connected transmit/receive channel especially in such a way that an MRI scan is stopped according to step 20 (abrt) if one or more of these local values exceed a certain allowed maximum value in order not to harm a patient or to exceed a certain SAR value. As long as these local values remain below the related maximum values allowed, the main MRI scan is continued up to its normal end (step 21).

The above described method can also be applied in case in which the multi-port RF resonator is used for the mode of hyperthermia therapy (especially in combination with MR imaging) in which the multi-port RF resonator serves as a fully controlled electromagnetic heating source especially for selective heating of certain regions within an examination object by an according selective RF excitation by means of certain selected activated ports. Whereas for MR imaging a homogeneous resonant mode and low SAR parameter set is required, a different shim setting can be selected to locally increase the SAR and the RF excitation and by this the local heating especially of tissue.

Further, a local transmit/receive resonator can be located on the examination object and can be selected simultaneously with the whole body RF (volume) resonator. Locally or temporally RF transmitting during a MR sequence by means of such a local RF resonator has advantages especially in case of using certain contrast agents.

While the invention has been illustrated and described in detail in the drawings and foregoing description, such illustration and description are to be considered illustrative or exemplary and not restrictive, and the invention is not limited to the disclosed embodiments. Variations to embodiments of the invention described in the foregoing are possible without departing from the scope of the invention as defined by the accompanying claims.

Variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A radio frequency (RF) volume resonator system for use in an MR imaging system, the RF volume resonator system comprising:
   a multi-port RF volume resonator comprising a plurality of ports which are positioned at the resonator for exciting and/or receiving RF/MR signals by transmit and/or receive channels, wherein:
   a plurality of transmit and/or receive channels is provided which each at least comprise an ON/OFF switch for connecting and disconnecting each one transmit and/or receive channel with/from each one of the ports by switching the related ON/OFF switch between an ON and an OFF state, respectively, wherein the ON/OFF switches can be switched between the ON and the OFF state independently from each other by through an individual switch signal, wherein each of the plurality of transmit and/or receive channels comprises a matching network for matching the related port of the RF volume resonator to an impedance of a connected power amplifier or of a connected low noise amplifier, and
   a control unit for generating the switch signals for selecting at least two of the ports of the RF resonator for connecting with each one of the transmit and/or receive channels for exciting and/or receiving RF/MR signals for conducting an MR imaging of an examination object.

2. The RF volume resonator system according to claim 1, wherein the control unit is provided for selecting at least two ports of the RF resonator for connecting with each one of the transmit and/or receive channels in dependence on physical properties of an examination object.

3. The RF volume resonator system according to claim 2, wherein the physical properties of the examination object are selected such that the homogeneity of a resonant RF mode excited by the RF volume resonator is a maximum and/or the resulting value of the SAR of the examination object is a minimum.

4. The RF volume resonator system according to claim 1, wherein the multi-port RF volume resonator is a whole body coil or a local coil.

5. The RF volume resonator system according to claim 1, wherein the multi-port RF volume resonator is an RF birdcage coil or a transverse electromagnetic (TEM) resonator.

6. The RF volume resonator system according to claim 1, wherein the switches are switched into the ON or the OFF state repeatedly according to a predetermined or desired sequence which is input into the control unit.

7. The RF volume resonator system according to claim 1, wherein the control unit is provided for predetermining or evaluating values of amplitudes and/or frequencies and/or phases and/or pulse shapes of RF transmit signals to be generated by those transmit/receive channels, which are connected by a related ON/OFF switch in an ON state with a port of the RF resonator, wherein the said values are predetermined or evaluated in dependence on physical properties of an examination object such that the homogeneity of a resonant RF mode excited by the RF volume resonator is a maximum and/or the resulting value of the specific absorption rate (SAR) of the examination object is a minimum.

8. The RF volume resonator system according to claim 1, wherein at least one of the ports a local coil or sensor coil is arranged for sensing the strength of the local RF current or of the local RF field.

9. The RF volume resonator system according to claim 1, wherein at least one of the switches comprises a first and a second diode which are connected in series into each one connection line between a port of the RF volume resonator and the related transmit/receive channel, wherein both diodes are connected with their poles in opposite directions to each other, and a first and a second bias voltage source which are each connected in parallel to the first and the second diode, respectively, for biasing the first and the second diode, respectively, conductive or non-conductive, wherein the bias voltage sources are switchable by the switch signal.

10. A method for magnetic resonance (MR) imaging an examination object by the RF volume resonator system according to claim 1, wherein the MR imaging of the examination object is conducted by providing switch signals to the switches for switching the switches into the ON or OFF state according to a sequence which is predetermined or selected, each in dependence on physical properties of an examination object like volume, weight, size and water/fat ratio such that the homogeneity of a resonant RF mode excited by the RF volume resonator is a maximum and/or the resulting value of the specific absorption rate (SAR) of the examination object is a minimum.

11. The method according to claim 10, comprising a first step in the form of an MRI pre-scan for evaluating and storing values of amplitudes and/or frequencies and/or phases and/or for evaluating and storing pulse shapes of RF transmit signals to be generated by each of the transmit/ receive channels, when they are connected with the related ports by the switches in an ON state, wherein the values are evaluated in dependence on physical properties of an examination object such that the resulting homogeneity of a resonant RF mode excited by the RF resonator is a maximum and/or the resulting value of the SAR of the examination object is a minimum, and a second step in the form of a main MRI scan for MR imaging the examination object by switching the switches into the ON or the OFF state according to a predetermined or desired or an evaluated sequence.

12. The method according to claim 11, wherein values of amplitudes and/or frequencies and/or phases and/or pulse shapes of RF transmit signals to be generated by each of the transmit/receive channels are selected form a look-up table in dependence on physical properties of an examination object.

13. A magnetic resonance (MR) imaging system comprising the RF volume resonator system according to claim 1.

14. A radio frequency (RF) volume resonator system for use in an MR imaging system, the RF volume resonator system comprising:
   a multi-port RF volume resonator comprising a plurality of ports that are positioned at the resonator for exciting and/or receiving RF/MR signals by through transmit and/or receive channels, wherein:
   a plurality of transmit and/or receive channels is provided wherein each comprise an ON/OFF switch for connecting and disconnecting each one transmit and/or receive channel with/from each one of the ports by switching the related ON/OFF switch between an ON and an OFF state, respectively, wherein the ON/OFF switches can be switched between the ON and the OFF state independently from each other by an individual switch signal; and
   a control unit for generating the switch signals for selecting at least two of the ports of the RF resonator for connecting with each one of the transmit and/or receive channels for exciting and/or receiving RF/MR signals for conducting an MR imaging of an examination object, wherein the control unit is provided for selecting at least two ports of the RF resonator for connecting with each one of the transmit and/or receive channels in dependence on physical properties of an examination object such that the homogeneity of a resonant RF mode excited by the RF volume resonator is a maximum and/or the resulting value of the specific absorption rate (SAR) of the examination object is a minimum.

15. The RF volume resonator of claim 14, wherein at least one of the plurality of transmit and/or receive channels comprises a matching network for matching the related port of the RF volume resonator to an impedance of at least one of a group selected from a connected power amplifier and a connected low noise amplifier.

16. A radio frequency (RF) volume resonator system for use in an MR imaging system, the RF volume resonator system comprising:
   a multi-port RF volume resonator comprising a plurality of ports that are positioned at the resonator for exciting and/or receiving RF/MR signals by through transmit and/or receive channels,
   a plurality of transmit and/or receive channels is provided wherein each comprise an ON/OFF switch for connecting and disconnecting each one transmit and/or receive channel with/from each one of the ports by switching the related ON/OFF switch between an ON and an OFF state, respectively, wherein the ON/OFF switches can be switched between the ON and the OFF state independently from each other by an individual switch signal; and
   a control unit for generating the switch signals for selecting at least two of the ports of the RF resonator for connecting with each one of the transmit and/or receive channels for exciting and/or receiving RF/MR signals for conducting an MR imaging of an examination object,
   wherein at least one of the ports is arranged for sensing a strength of at least one of a local RF current and a local RF field.

17. The RF volume resonator system according to claim 16, wherein the control unit is provided for selecting at least two ports of the RF resonator for connecting with each one of the transmit and/or receive channels in dependence on physical properties of an examination object.

18. The RF volume resonator of claim 16, wherein at least one of the plurality of transmit and/or receive channels comprises a matching network for matching the related port of the RF volume resonator to an impedance of at least one of a group selected from a connected power amplifier and a connected low noise amplifier.

* * * * *